United States Patent
Duarte et al.

(10) Patent No.: US 10,082,265 B2
(45) Date of Patent: Sep. 25, 2018

(54) AUTOMOTIVE VEHICLE LIGHTING DEVICE WITH ELECTRICAL CONNECTION CIRCUIT BOARD CONNECTED TO SUBSTRATE BY ANISOTROPIC CONDUCTIVE FILM

(71) Applicant: VALEO VISION, Bobigny (FR)

(72) Inventors: Marc Duarte, Villemomble (FR); Zdravko Zojceski, Courbevoie (FR); Jean-Michel Morelle, Beaugency (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 15/424,038

(22) Filed: Feb. 3, 2017

(65) Prior Publication Data

US 2017/0227186 A1 Aug. 10, 2017

(30) Foreign Application Priority Data

Feb. 4, 2016 (FR) ..................... 16 50878

(51) Int. Cl.
*H01R 12/57* (2011.01)
*H05K 1/09* (2006.01)
(Continued)

(52) U.S. Cl.
CPC ........... *F21S 43/195* (2018.01); *F21S 41/141* (2018.01); *F21S 41/192* (2018.01); *F21S 43/14* (2018.01);
(Continued)

(58) Field of Classification Search
CPC ..... F21S 48/212; H01L 33/486; H05K 1/181; H05K 1/0203; H05K 1/0306
See application file for complete search history.

(56) References Cited

U.S. PATENT DOCUMENTS

2001/0031509 A1  10/2001  Yamazaki
2003/0047280 A1   3/2003  Takayama et al.
(Continued)

FOREIGN PATENT DOCUMENTS

KR  10-2012-0126770 A  11/2012
KR  10-2012-0130409 A  12/2012

OTHER PUBLICATIONS

French Preliminary Search Report dated Oct. 17, 2016 in French Patent Application No. 1650878 (with English translation of categories of cited documents).

*Primary Examiner* — Joseph L Williams
(74) *Attorney, Agent, or Firm* — Oblon, McClelland, Maier & Neustadt, L.L.P.

(57) ABSTRACT

An illumination and/or signaling device for an automotive vehicle includes a dielectric substrate including a plurality of conductive tracks, and a plurality of light-emitting diodes surface-mounted on the dielectric substrate. The light emitting diodes are electrically connected to the conductive tracks of the dielectric substrate according to a predetermined connection plan. At least one control circuit board for controlling the light-emitting diodes includes a plurality of connecting pins and an electrical connection circuit board including a plurality of conductive lines for electrically connecting the connecting pins of the control circuit board to the conductive tracks of the dielectric substrate according to a predetermined connection plan. The electrical connection circuit board is connected to the conductive tracks of the dielectric substrate via an anisotropic conductive film.

8 Claims, 1 Drawing Sheet

(51) Int. Cl.

| | | |
|---|---|---|
| *F21S 43/19* | (2018.01) | |
| *F21S 43/20* | (2018.01) | |
| *F21S 41/19* | (2018.01) | |
| *F21S 41/141* | (2018.01) | |
| *F21S 43/14* | (2018.01) | |
| *F21S 8/10* | (2006.01) | |
| *H01L 33/48* | (2010.01) | |
| *H05K 1/02* | (2006.01) | |
| *H05K 1/03* | (2006.01) | |
| *H05K 1/18* | (2006.01) | |
| *F21S 45/47* | (2018.01) | |
| *F21Y 115/10* | (2016.01) | |

(52) U.S. Cl.
CPC ........... *F21S 43/255* (2018.01); *F21S 48/115* (2013.01); *F21S 48/1109* (2013.01); *F21S 48/212* (2013.01); *F21S 48/215* (2013.01); *F21S 48/2218* (2013.01); *H01L 33/486* (2013.01); *H01R 12/57* (2013.01); *H05K 1/0203* (2013.01); *H05K 1/0306* (2013.01); *H05K 1/09* (2013.01); *H05K 1/181* (2013.01); *F21S 45/47* (2018.01); *F21S 48/328* (2013.01); *F21Y 2115/10* (2016.08); *H05K 2201/10106* (2013.01)

(56) References Cited

U.S. PATENT DOCUMENTS

| | | |
|---|---|---|
| 2003/0209974 A1 | 11/2003 | Yamazaki |
| 2006/0145168 A1 | 7/2006 | Yamazaki |
| 2009/0042356 A1 | 2/2009 | Takayama et al. |
| 2009/0291516 A1 | 11/2009 | Takayama et al. |
| 2012/0217501 A1 | 8/2012 | Takayama et al. |
| 2014/0264351 A1 | 9/2014 | Takayama et al. |
| 2015/0054417 A1 | 2/2015 | Lee |
| 2016/0190219 A1 | 6/2016 | Takayama et al. |
| 2016/0248013 A1 | 8/2016 | Takayama et al. |

AUTOMOTIVE VEHICLE LIGHTING DEVICE WITH ELECTRICAL CONNECTION CIRCUIT BOARD CONNECTED TO SUBSTRATE BY ANISOTROPIC CONDUCTIVE FILM

TECHNICAL FIELD

The present invention pertains to the field of illumination and signaling for vehicles, in particular for automotive vehicles. The invention more particularly relates to an illumination or signaling device for an automotive vehicle.

PRIOR ART

It is now known practice to use light-emitting diodes (LEDs) in the automotive field for illumination, in particular for illuminating the road, or for signaling, in particular for signaling to other vehicles and road users. The devices used generally employ a plurality of LEDs mounted on a substrate forming a support. These LEDs are positioned on the substrate so as to form the desired illumination and/or signaling pattern.

The LEDs are controlled by at least one control circuit board positioned in proximity to the substrate. The control circuit board is connected to the plurality of LEDs by means of an electrical connection circuit board is connected by means of surface-mount technology (SMT).

Currently, the dimensions of the substrate are dictated not directly by the number of LEDs to be mounted on the substrate, since it is now possible to produce LEDs of very small size, but by the dimensions of the connection zone between the electrical connection circuit board and the substrate.

Current surface-mount technology (SMT) dictates a pitch between two adjacent connection points of the order of 0.3 mm to 0.5 mm, thereby limiting the density of interconnection between the electrical connection circuit board and the substrate.

SUMMARY OF THE INVENTION

One object of the invention is to propose an illumination or signaling device comprising a plurality of light-emitting diodes mounted on a substrate having a limited area.

Another object of the invention is to propose an illumination or signaling device which is easy to produce.

According to the invention, it is proposed to connect the electrical connection circuit board to the substrate by means of an anisotropic conductive film (ACF) so as to substantially decrease the pitch between the connection points.

Thus, the invention relates to a lighting device for an automotive vehicle, in particular for illumination and/or signaling for an automotive vehicle, comprising:
- a dielectric substrate comprising a plurality of conductive tracks;
- a plurality of light-emitting diodes surface-mounted on said dielectric substrate, the light-emitting diodes being electrically connected to the conductive tracks of the dielectric substrate according to a predetermined connection plan;
- at least one control circuit board for controlling the light-emitting diodes, said control circuit board comprising a plurality of connecting pins; and
- an electrical connection circuit board comprising a plurality of conductive lines for electrically connecting the connecting pins of the control circuit board to the conductive tracks of the dielectric substrate according to a predetermined connection plan, noteworthy in that the electrical connection circuit board is connected to the conductive tracks of the dielectric substrate via an anisotropic conductive film.

The use of an anisotropic conductive film makes it possible to decrease the pitch between the connection points at the connection between the substrate and the electrical connection circuit board. A pitch of between 0.035 and 0.200 mm may then be obtained. The connection zone where the electrical connection circuit board is connected to the substrate is then decreased. It is then possible to integrate a larger number of LEDs without increasing the size of the substrate or to decrease the size of the substrate while retaining the same number of LEDs.

According to one particular embodiment, the anisotropic conductive film comprises a plurality of electrical conduction pathways, the pitch between two adjacent conduction pathways being between 0.035 and 0.200 mm.

According to one particular embodiment, the electrical connection circuit board is a flexible integrated circuit.

According to one particular embodiment, the dielectric substrate is mounted on a heat dissipation circuit board.

According to one particular embodiment, the dielectric substrate is made of a ceramic material.

According to one particular embodiment, the dielectric substrate comprises aluminum nitride.

According to one particular embodiment, the anisotropic conductive film comprises a layer of adhesive material and conductive balls, which conductive balls are agglomerated together in said layer of adhesive material so as to form said conduction pathways.

According to one particular embodiment, the conductive balls (41) are plastic balls covered with nickel, gold or a mixture of gold and nickel.

Other advantages may also become apparent to those skilled in the art upon reading the examples below, which are illustrated by the appended figures and given by way of illustration.

DETAILED DESCRIPTION OF THE INVENTION

Figure 1:
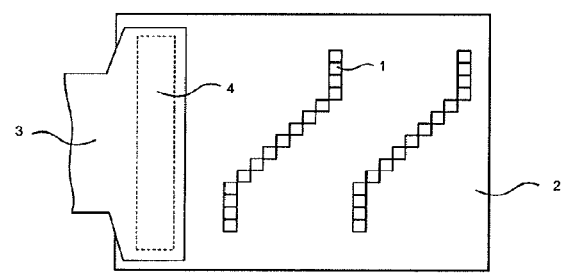
FIG. 1 shows a partial view from above of a device according to the invention.
Figure 2:
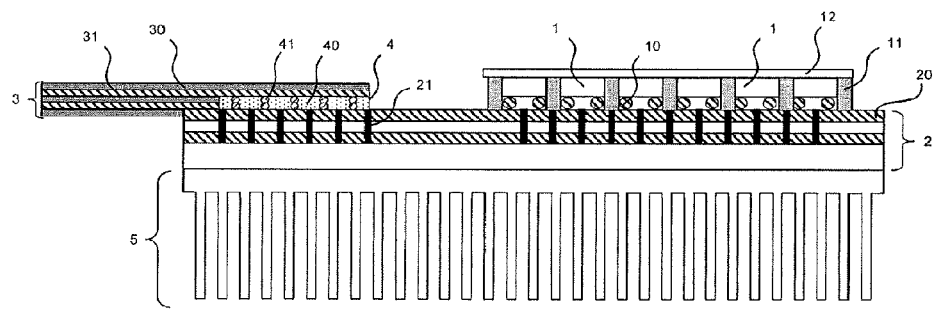
FIG. 2 shows an enlarged cross-sectional view of the device of FIG. 1.

With reference to FIGS. 1 and 2, the device of the invention comprises a matrix of light-emitting diodes (LEDs) 1 surface-mounted on a dielectric substrate 2.

The diodes are positioned on the substrate so as to form the desired illumination or signaling lighting pattern.

The dielectric substrate 2 is advantageously made of a ceramic material and comprises a plurality of conductive (or metal) tracks distributed over one or two metal layers according to the number of diodes 1 of the lighting pattern. In the example illustrated, the dielectric substrate 2 is based on aluminum nitride (AlN) and comprises two metal layers 20 as illustrated in FIG. 2. Vias 21, made of copper or tungsten, are provided in order to connect metal tracks belonging to two separate metal layers to one another.

The anode and the cathode of the LEDs 1 are connected to the metal tracks of the substrate by means of soldering, bonding or other assembly means. In the example illustrated, the anode and the cathode of the LEDs are connected to the metal tracks of the substrate by balls 10 made of nickel and gold (NiAu) according to a predetermined connection plan.

Partitions 112 are positioned between the LEDs 1 in order to reflect the light toward the exterior. These partitions are for made of a material comprising titanium dioxide ($TiO_2$) and silicon (Si).

The matrix of LEDs is moreover covered by a luminophore layer 12 for converting the colored light produced by the LEDs to a white light. A luminophore denotes a light converter comprising at least one luminescent material designed to absorb at least a portion of at least one excitation light emitted by a light source and to convert at least a portion of said absorbed excitation light to a light emission having a wavelength that is different from that of the excitation light. In the case of yellow light, the material of the luminophore is, for example, one of the following components: $Y_3A_{15}O_{12}:Ce^{3+}$ (YAG), $(Sr, Ba)_2SiO_4:Eu^{2+}$, $Ca_x(Si, Al)_{12}(O, N)_{16}:Eu^{2+}$.

The device of the invention additionally comprises one or more control circuit boards (not shown in the figures) for controlling the LEDs. This control circuit board is connected to the substrate 2 via an electrical connection circuit board 3. This connection circuit board is advantageously a flexible integrated circuit comprising a plurality of conductive tracks which are distributed over one or more metal layers 31 mounted on a dielectric substrate 30.

This connection circuit board 3 is intended to electrically connect connecting pins of the one or more control circuit boards to the metal tracks of the substrate 2 according to a predetermined connection plan.

According to one important aspect of the invention, the conductive tracks of the connection circuit board 3 are connected to the conductive tracks of the substrate 2 via an anisotropic conductive film 4 (ACF). As shown in FIG. 2, the ACF film 4 is interposed between the connection circuit board 3 and the substrate 2.

This ACF film 4 comprises a layer of adhesive material 40 in which conductive balls 41 are present. The balls are, for example, plastic balls covered with nickel and/or gold having a diameter of 10 μm. The ACF film used is, for example, the film with the reference CP801AM-35AC or CP801AM-45AC marketed by the company Dexerials. This ACF film behaves like a double-sided adhesive strip, one of the sides of the ACF film 4 being bonded to one side of the connection circuit board 3 and the other side being bonded to one side of the substrate 2.

The conductive balls 41 are agglomerated together by heating the ACF film to a temperature of between 150° C. and 200° C. and by applying a pressure of the order of 2 to 4 Mpa so as to form electrical conduction pathways (or current pathways) in a substantially vertical direction at the locations at which the pressure is applied.

The cross section of the conduction pathways and the pitch between these conduction pathways may be decreased by virtue of the small diameter of the conductive balls (10 μm). A pitch between adjacent conduction pathways of between 0.035 and 0.200 mm may thus be obtained.

The size of the connection zone where the electrical connection circuit board 3 is connected to the substrate 2 may thus be decreased. Consequently, it is then possible to increase the number of LEDs on the substrate without increasing the size of the latter or to decrease the size of the substrate while retaining the same number of LEDs.

Advantageously, the substrate 2 is mounted on a heat dissipation circuit board 5 in order to avoid the substrate heating up when the LEDs are turned on. Each LED (=1 pixel) is, for example, controlled by the control circuit board with a current of the order of 120 mA and a voltage of 3.3 V, i.e. a power of about 400 mW (40 lumens).

The invention has been described in the above by way of example. It is understood that a person skilled in the art is capable of producing various variant embodiments of the invention, for example by associating the various features above, taken individually or in combination, without departing from the scope of the invention.

The invention claimed is:

1. Lighting device for an automotive vehicle, in particular for illumination and/or signaling, comprising:
    a dielectric substrate comprising a plurality of conductive tracks;
    a plurality of light-emitting diodes surface-mounted on said dielectric substrate, the light-emitting diodes being electrically connected to the conductive tracks of the dielectric substrate according to a predetermined connection plan;
    at least one control circuit board for controlling the light-emitting diodes, said control circuit board comprising a plurality of connecting pins; and
    an electrical connection circuit board comprising a plurality of conductive lines for electrically connecting the connecting pins of the control circuit board to the conductive tracks of the dielectric substrate according to a predetermined connection plan,
    wherein the electrical connection circuit board is connected to the conductive tracks of the dielectric substrate via an anisotropic conductive film.

2. Lighting device according to claim 1, wherein the anisotropic conductive film comprises a plurality of electrical conduction pathways, the pitch between two adjacent conduction pathways being between 0.035 and 0.200 mm.

3. Lighting device according to claim 1, wherein the electrical connection circuit board is a flexible integrated circuit.

4. Lighting device according to claim 1, wherein the dielectric substrate is mounted on a heat dissipation circuit board.

5. Lighting device according to claim 1, wherein dielectric substrate is made of a ceramic material.

6. Lighting device according to claim 5, wherein the dielectric substrate comprises aluminum nitride.

7. Lighting device according to claim 1, wherein the anisotropic conductive film comprises a layer of adhesive material and conductive balls, which conductive balls are agglomerated together in said layer of adhesive material so as to form said conduction pathways.

8. Lighting device according to claim 7, wherein the conductive balls are plastic balls covered with nickel, gold or a mixture of gold and nickel.

* * * * *